United States Patent
Chen et al.

(10) Patent No.: US 7,988,813 B2
(45) Date of Patent: Aug. 2, 2011

(54) DYNAMIC CONTROL OF PROCESS CHEMISTRY FOR IMPROVED WITHIN-SUBSTRATE PROCESS UNIFORMITY

(75) Inventors: Lee Chen, Cedar Creek, TX (US); Radha Sundararajan, Dripping Springs, TX (US); Merritt Funk, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 311 days.

(21) Appl. No.: 11/684,853

(22) Filed: Mar. 12, 2007

(65) Prior Publication Data
US 2008/0223873 A1 Sep. 18, 2008

(51) Int. Cl.
*H01L 21/306* (2006.01)
(52) U.S. Cl. ........... 156/345.34; 118/715; 216/58; 428/66.4; 222/1; 222/3; 137/2
(58) Field of Classification Search ............. 156/345.33, 156/345.34; 118/715; 216/58; 428/66.4; 137/2
See application file for complete search history.

(56) References Cited

U.S. PATENT DOCUMENTS

| | | | | |
|---|---|---|---|---|
| 5,620,523 A * | 4/1997 | Maeda et al. | ........... | 118/723 IR |
| 5,637,146 A * | 6/1997 | Chyi | ............ | 117/200 |
| 6,090,210 A * | 7/2000 | Ballance et al. | ............ | 118/725 |
| 6,473,993 B1 * | 11/2002 | Yagi et al. | ........... | 34/380 |
| 6,492,612 B1 | 12/2002 | Taguchi et al. | | |
| 6,740,853 B1 * | 5/2004 | Johnson et al. | ........... | 219/444.1 |
| 7,064,812 B2 * | 6/2006 | Ludviksson et al. | ........... | 356/72 |
| 2003/0124820 A1 | 7/2003 | Johnsgard et al. | | |
| 2006/0090855 A1 | 5/2006 | Kimura | | |
| 2006/0100824 A1 * | 5/2006 | Moriya | ........... | 702/183 |
| 2006/0207507 A1 | 9/2006 | Oohashi et al. | | |
| 2007/0040265 A1 | 2/2007 | Umotoy et al. | | |

FOREIGN PATENT DOCUMENTS

| | | | |
|---|---|---|---|
| JP | 2002-217171 | * | 8/2002 |
| WO | 02/086957 A1 | | 10/2002 |
| WO | 02084710 A2 | | 10/2002 |
| WO | 2008075340 A1 | | 6/2008 |

OTHER PUBLICATIONS

European Patent Office, Search Report and Written Opinion, from related PCT/US2008/056478, dated Dec. 4, 2008.

* cited by examiner

*Primary Examiner* — Ram Kackar
*Assistant Examiner* — Satish Chandra
(74) *Attorney, Agent, or Firm* — Wood, Herron & Evans, LLP

(57) ABSTRACT

A method and system for dynamically controlling a process chemistry above a substrate is described. The system for adjusting the process chemistry comprises a ring configured to surround a peripheral edge of a substrate in a vacuum processing system. The ring comprises one or more gas distribution passages formed within the ring and configured to supply an additive process gas through an upper surface of the ring to the peripheral region of the substrate, wherein the one or more gas distribution passages are configured to be coupled to one or more corresponding gas supply passages formed within the substrate holder upon which the ring rests.

8 Claims, 3 Drawing Sheets

DYNAMIC CONTROL OF PROCESS CHEMISTRY FOR IMPROVED WITHIN-SUBSTRATE PROCESS UNIFORMITY

This application is related to U.S. patent application Ser. No. 11/684,818 entitled "Dynamic Temperature Backside Gas Control For Improved Within-Substrate Process Uniformity" by the inventors hereof, filed on even date herewith, and commonly assigned U.S. patent application Ser. No. 11/684,957 entitled "Method For Flexing A Substrate During Processing", filed on even date herewith by Merritt Funk; and hereby expressly incorporated by reference herein.

FIELD OF THE INVENTION

This invention relates to the control of process uniformity across a substrate, including, for example, process uniformity during an etching process performed on a substrate. The invention particularly relates to the control of process uniformity across a substrate by control of the process chemistry.

BACKGROUND OF THE INVENTION

In semiconductor manufacturing, the complexity of devices formed on semiconductor substrates continues to increase at a rapid pace, while the size of features, such as transistor gates, continues to decrease well below the 93 nanometer (nm) technology node. As a result, manufacturing processes require increasingly sophisticated unit process and process integration schemes, as well as process and hardware control strategies to ensure the uniform fabrication of devices across the substrate. For example, during the fabrication of a gate electrode structure in a transistor device, patterning systems and etching systems, which facilitate the formation of the gate structure in a plurality of material films formed on the substrate, are required to achieve and preserve the gate structure critical dimension (CD) vertically within the device being fabricated as well as laterally across the substrate from device-to-device. A reduction of variations in the CD, as well as variations in profile and side-wall angle (SWA), across the substrate can affect the uniform yield of high performance devices (i.e., speed, power consumption, etc.).

In material processing methodologies, patterning and etching systems are utilized to perform pattern etching, which comprises applying a thin layer of radiation-sensitive material, such as photoresist, to an upper surface of a substrate, patterning this thin layer of radiation-sensitive material using photolithography to form a pattern therein, and transferring the pattern to the underlying material film using an etching process. For example, the patterning of the radiation-sensitive material generally involves coating an upper surface of the substrate with a thin film of radiation-sensitive material (e.g., "photo-resist"), and then exposing the radiation-sensitive material to a geometric pattern of electromagnetic (EM) radiation using, for example, a photolithography system, followed by the removal of the irradiated regions of the radiation-sensitive material (as in the case of positive photo-resist), or non-irradiated regions (as in the case of negative photo-resist) using a developing solvent. Thereafter, the pattern formed in the thin film of radiation-sensitive material is transferred to the underlying layers using an etching process, such as a dry plasma etching process.

During a dry plasma etching process, plasma and the chemistry formed in the presence of plasma are utilized to remove or etch material along fine lines or within vias or contacts patterned on a substrate. The plasma etch process generally involves positioning a semiconductor substrate with an overlying patterned, protective layer, for example a photoresist layer as described above, in a processing chamber. Once the substrate is positioned within the chamber, an ionizable, dissociative gas mixture is introduced within the chamber at a pre-specified flow rate, while a vacuum pump is adjusted to achieve an ambient process pressure. Thereafter, plasma is formed when a fraction of the gas species present are ionized by electrons heated in the presence of an alternating electric field which is created via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once plasma is formed, selected surfaces of the substrate are etched by the plasma. The process is adjusted to achieve appropriate conditions, including an appropriate concentration of desirable reactant and ion populations to etch various features (e.g., trenches, vias, contacts, etc.) in the selected regions of the substrate. Such substrate materials where etching is required include silicon dioxide ($SiO_2$), low-k dielectric materials, poly-silicon, and silicon nitride.

In these plasma etching systems, the uniformity of process results across the substrate are affected by spatial variations in plasma density within the process space above the substrate, typically expressed as a spatial distribution of electron density $n_e(r,\theta)$, spatial variations in process chemistry (i.e., spatial distribution of chemical species), and spatial variations of the substrate temperature. Often times, the residence time $\tau(r,\theta)$ of chemical species in the process space may be correlated with the amount of plasma dissociation occurring due to interactions between chemical constituents and energetic electrons and, hence, the residence time may be correlated with process chemistry; i.e., the greater the residence time, the greater the amount of dissociation of chemical constituents and the lesser the residence time, the lesser the dissociation of chemical constituents.

During an etching process, the uniformity of process results can include the uniformity (or non-uniformity) of the spatial distribution of a feature critical dimension (CD) across the substrate or a side-wall angle (SWA) across the substrate. For example, during gate structure formation, it is desirable to achieve a uniform distribution of the gate width (at the top and bottom of the etched feature, as well as the region therebetween) across the substrate following an etching process or series of etching processes.

Since improving process uniformity in semiconductor manufacturing has always been an important goal, there remains a need for systems that improve process parameter uniformity across the surfaces of substrates during processing.

SUMMARY OF THE INVENTION

A general objective of the present invention is to improve process uniformity in semiconductor manufacturing across the surfaces of substrates during processing.

A more particular objective of the invention is to provide process parameter control to offset non-uniform effects of process conditions to improve process uniformity across the surfaces of substrates.

According to the present invention, a method and system for dynamically controlling a process chemistry above a substrate is described.

According to one embodiment, a gas distribution ring or focus ring configured to surround a peripheral edge of a substrate in a vacuum processing system is described. The ring comprises one or more gas distribution passages formed within the ring and configured to supply an additive process gas through an upper surface of the ring to the peripheral region of the substrate, wherein the one or more gas distribution passages are configured to be coupled to one or more corresponding gas supply passages formed within the substrate holder upon which the ring rests.

According to another embodiment, a method of adjusting the flow of additive process gas through the ring described above is provided. The method comprises disposing the ring around a substrate in a vacuum processing system, and adjusting a flow of an additive process gas through the ring to a peripheral region of the substrate, by adjusting a flow rate of additive process gas, or a composition of additive process gas, or both.

In certain embodiments of the invention, the introduction of gas through the ring is controlled in such a way as to control radial variations in process parameters.

In other embodiments of the invention, the ring multiple inlet ports, flow control elements or other structure that allows gas to be supplied differently at different angular or circumferential regions around the ring.

In certain particular embodiments, the introduction of gas through the ring is controlled in such a way as to control angular or circumferential variations in process parameters.

Process chemistry or process gasses may be introduced through the ring to control the process and the uniformity of processing of the wafer, and may be used to compensate for factors in the process environment that would adversely affect the uniformity of the process performed on the substrate.

DETAILED DESCRIPTION

In the following description, for purposes of explanation and not limitation, specific details are set forth, such as a particular geometry of the substrate processing system and descriptions of various processes. However, it should be understood that the invention may be practiced in other embodiments that depart from these specific details.

The substrate processing system can comprise a plasma processing system configured to treat a substrate with plasma. Alternatively, the substrate processing system can comprise a non-plasma processing system configured to treat a substrate. The substrate processing system may comprise an etching system that utilizes plasma to facilitate a dry etching process during semiconductor manufacturing. Examples of an etching system are provided in U.S. Pat. No. 6,492,612 and PCT Publication WO 02/086957; each of which are hereby expressly incorporated herein by reference. Nonetheless, the invention can be used for improving uniformity in deposition systems or in other processing systems.

For example, the substrate processing system may include a thermal treatment module in a photoresist coating system such as a track system; a vapor deposition system such as a chemical vapor deposition (CVD) system, a plasma enhanced CVD (PECVD) system, an atomic layer deposition (ALD) system, a plasma enhanced ALD (PEALD) system, a physical vapor deposition (PVD) system or an ionized PVD (iPVD) system; a dry plasma etching system; a dry non-plasma etching system; a dry cleaning system; an ashing system; a chemical oxide removal (COR) system; or a single substrate thermal processing system configured to thermally treat a substrate.

The substrate processing system may be configured to process a substrate of arbitrary shape. A typical substrate may be a circular wafer of various diameters including, but not limited 200 millimeters (mm), 300 mm, 450 mm, or larger. Additionally, for example, the substrate may be a semiconductor substrate, such as a silicon substrate or SiGe substrate, or a silicon-on-insulator (SOI) substrate. Alternatively, for example, the substrate may have a rectangular shape, such as a flat panel or liquid crystal display (LCD).

Figure 1:
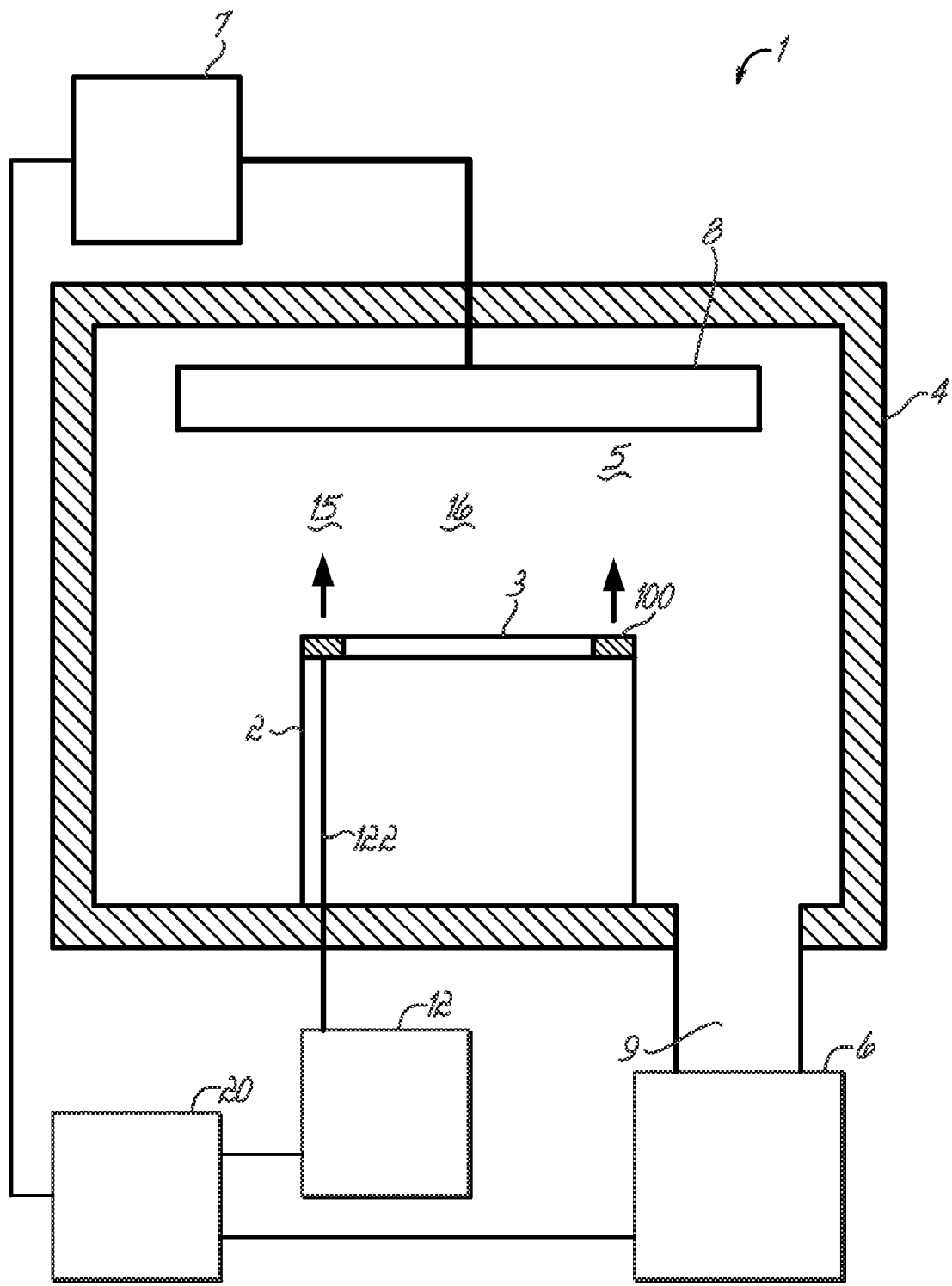
FIG. 1 provides a simplified diagram of a substrate processing system having a substrate holder.

In the drawings, where like reference numerals designate identical or corresponding parts throughout the several views, FIG. 1 provides a simplified diagram of a vacuum processing system 1. The vacuum processing system 1 comprises a vacuum processing chamber 4 configured to facilitate the formation of a process environment in process space 5 for treating a substrate 3, a substrate holder 2 coupled to the vacuum processing chamber 4 and configured to support substrate 3, a vacuum pumping system 6 coupled to the vacuum processing chamber 4 and configured to evacuate process space 5 through vacuum pumping port 9, and a process gas supply system 7 coupled to the vacuum processing chamber 4 and configured to introduce a process gas to process space 5 through a process gas distribution system 8. Vacuum processing system 1 may or may not facilitate the generation of plasma to assist the processing of substrate 3. For example, vacuum processing system 1 may include an etching system comprising a plasma generation system (not shown for forming plasma from process gas in process space 5.

Referring still to FIG. 1, the process gas distribution system 8 can include a showerhead gas injection system having a gas distribution assembly, and a gas distribution plate coupled to the gas distribution assembly and configured to form a gas distribution plenum therein. Although not shown, gas distribution plenum can comprise one or more gas distribution baffle plates configured to distribute process gas evenly behind the gas distribution plate. The gas distribution plate further comprises a plurality of gas distribution orifices to distribute the process gas from the gas distribution plenum to process space 5 within vacuum processing system 1.

As described earlier, the uniformity of process results across the substrate 3 are affected by spatial variations in plasma density within the process space 5 above the substrate 3, typically expressed as a spatial distribution of electron density $n_e(r,\theta)$, spatial variations in process chemistry (i.e., spatial distribution of chemical species), and spatial variations of the substrate temperature. Often times, the residence time $\tau(r,\theta)$ of chemical species in the process space may be correlated with the amount of plasma dissociation occurring due to interactions between chemical constituents and energetic electrons and, hence, the residence time may be correlated with process chemistry; i.e., the greater the residence time, the greater the amount of dissociation of chemical constituents and the lesser the residence time, the lesser the dissociation of chemical constituents. Inherent to the gas distribution system 8 described above, the residence time for chemical constituents of process space 5 are different between a center region 16 of substrate 3 and an edge region 15 of substrate 3. Hence, the dissociation condition is different between the center region 16 and edge region 15 of substrate 3, which leads to non-uniform treatment of substrate 3 due to differences in process chemistry.

According to one embodiment, a device is described for altering the process gas composition proximate the edge of substrate 3. For example, the adjustment of the process gas composition at the edge of substrate 3 may be to compensate for differences in the residence time (or dissociation condition) inherent to such gas distribution systems. As illustrated in FIG. 1, the process gas composition is adjusted at the peripheral edge of substrate 3 by introducing additive gas at the peripheral edge of substrate 3 from an additive process gas supply 12.

Vacuum processing system 1 may further include a controller 20 that is coupled to the additive process gas supply system 12 and that can be configured to perform at least one of adjusting, controlling, or monitoring the flow of additive process gas into the vacuum processing chamber 4 through ring 10 at the periphery of substrate holder 2. Controller 20 may also be coupled to the process gas supply system 7 and the vacuum pumping system 6 that is coupled to an exhaust port 9 of the chamber 4.

Figure 2:
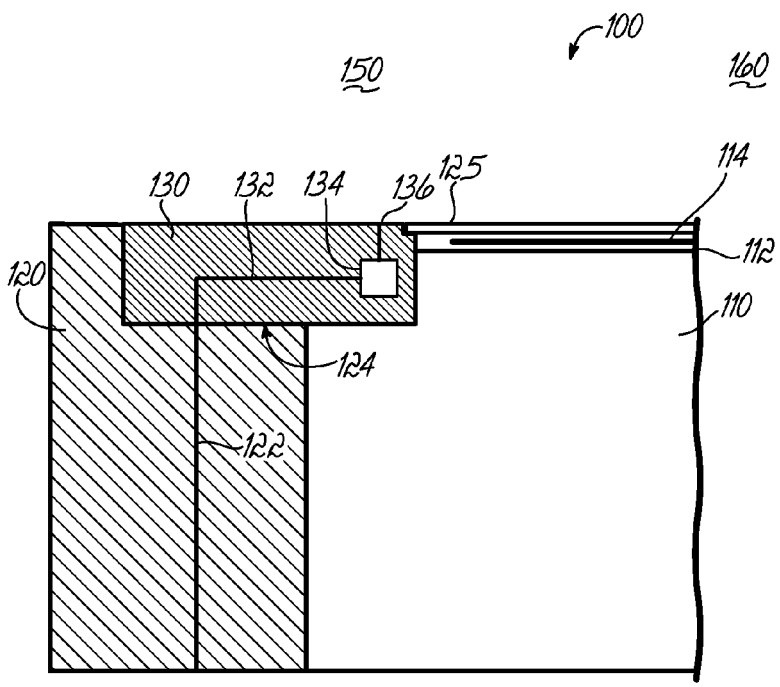
FIG. 2 provides a cross-sectional view of a substrate holder.

Referring to FIG. 2, a partial cross-sectional view of a substrate holder 100 is provided according to an embodiment of the substrate holder 2 of FIG. 1. Substrate holder 100 comprises an electrode 110, and an insulating member 120 configured to insulate the electrode 110 from an electrical ground member (not shown). For example, electrode 110 may be coupled to a radio frequency (RF) power source. Substrate holder 100 may include an electrostatic chuck (ESC) having an electrostatic clamp electrode 114 embedded within ESC ceramic layer 112.

The ring 10 of FIG. 1 may be a focus ring 130, comprising an upper surface, a lower surface, an outer surface at an outer diameter and an inner surface at an inner diameter, is coupled to an upper surface of electrode 110. The inner diameter of the inner surface of focus ring 130 is sufficiently large to accommodate substrate 125 and to center substrate 125 about the axis of revolution of electrode 110. Substrate 125 comprises an upper surface, a bottom surface, and an outer surface at an outer diameter facing the inner surface of focus ring 130. Substrate 125 is coupled to electrode 110 in such a way that the bottom surface of substrate 125 opposes the upper surface of electrode 110.

Referring still to FIG. 2, focus ring 130 is configured to introduce an additive process gas to the process space above substrate 125, thereby enabling the adjustment of the process gas composition in a peripheral region 150 of the process space relative to a central region 160 of the process space. The additive process gas is introduced to focus ring 130 by supplying the gas through a gas supply passage 122 formed in the insulating member 120 to a gas distribution passage 132 formed in focus ring 130. The coupling of additive process gas can occur at the interface 124 between the insulating member 120 and the focus ring 130. The lower surface of focus ring 130 and the upper surface of insulating member 120 that is configured to receive the lower surface of focus ring 130 may be prepared in a manner that prevents or minimizes the leakage of the additive process gas at the interface 124. For example, the lower surface of focus ring 130 and the upper surface of insulating member 120 can be machined to meet high degrees of tolerance on flatness specifications and roughness specifications. Furthermore, the focus ring 130 can comprise an alignment feature configured to mate with a respective feature in the insulating member 120 in order to ensure precise alignment of the gas supply passage 122 and the gas distribution passage 132.

A gas plenum 134 formed within focus ring 130 receives the additive process gas from gas distribution passage 132 and distributes the additive process gas to one or more gas injection orifices 136 in the upper surface of focus ring 130. The gas plenum 134 may extend circumferentially through focus ring 130. Alternatively, the gas plenum 134 may extend partially in the circumferential direction through focus ring 130.

Figure 3:
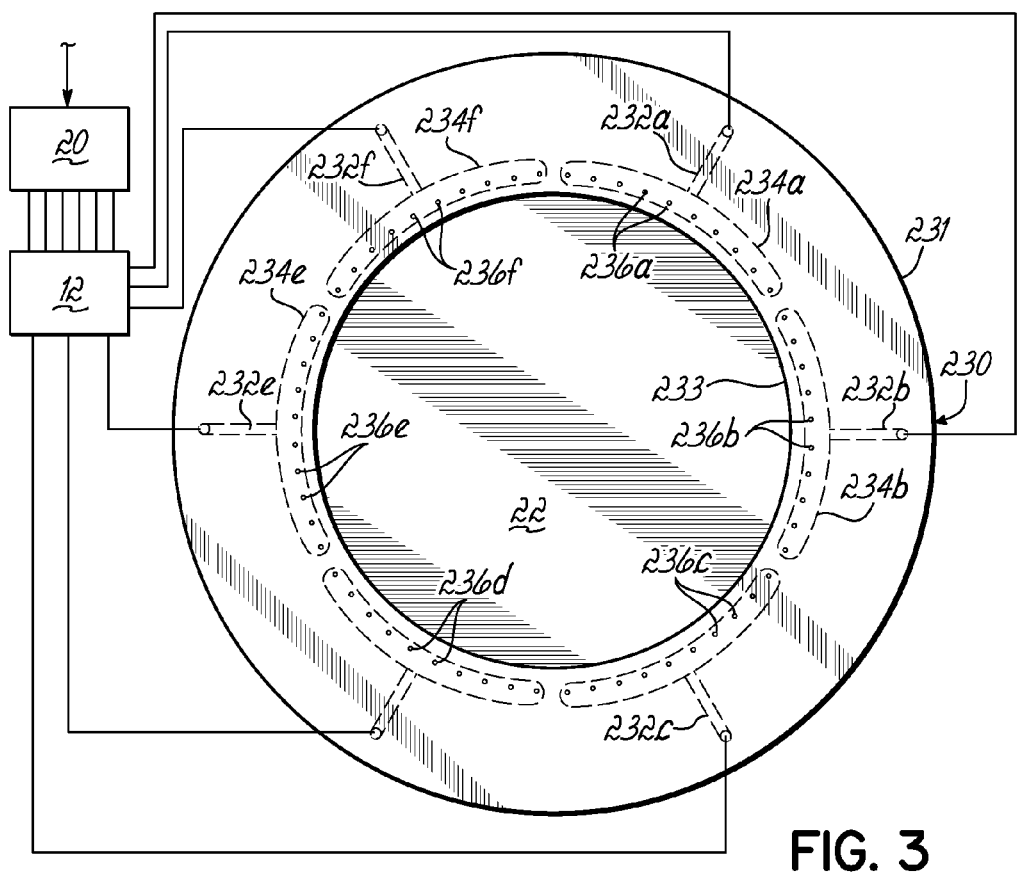
FIG. 3 provides a plan view of a focus ring according to an embodiment.

Referring now to FIG. 3, a plan view of a focus ring 230 is provided according to another embodiment of the focus ring 130 of FIG. 2. Focus ring 230 comprises an inner edge 233 and an outer edge 231, and a plurality of gas plenums 234 A-F positioned between the inner edge 233 and the outer edge 231. The plurality of gas plenums 234 A-F are configured to receive a flow of additive process gas from a plurality of gas distribution passages 232 A-F and distribute the respective flows of additive process gas to corresponding groups of gas injection orifices 236 A-F. The additive process gas is supplied from the additive process gas system 12, the flow of which is adjusted, controlled, or monitored by the controller 20. Each flow of additive process gas may be independently coupled to each gas distribution passage 232 A-F from separate and distinct gas supply passages. Alternatively, each flow of additive process gas may be coupled to each gas distribution passage 232 A-F from common gas supply passage 122 (FIG. 2), wherein the plurality of gas distribution passages 232 A-F are interconnected within focus ring 230. The flow rate of additive process gas to each gas plenum 234 A-F or the composition of the additive process gas delivered to each gas plenum 234 A-F or both may be varied. For example, one or more of the flow properties of the additive process gas may be adjusted in order to alter a process result (such as etch rate, etch selectivity, CD, profile, etc.) at a peripheral region of the substrate 22 relative to the center region of the substrate 22.

Focus rings 130 and 230 may be fabricated from a conductive material, a non-conductive material, or a semi-conductive material. Additionally, focus rings 130 and 230 may include a protective coating formed on a surface thereof. For example, the coating may include a ceramic coating or surface anodization. Focus rings 130 and 230 may be fabricated from quartz, silicon, single crystal silicon, polycrystalline silicon, silicon nitride, silicon carbide, carbon, glassy carbon, alumina, sapphire, aluminum nitride, etc.

Figure 4:
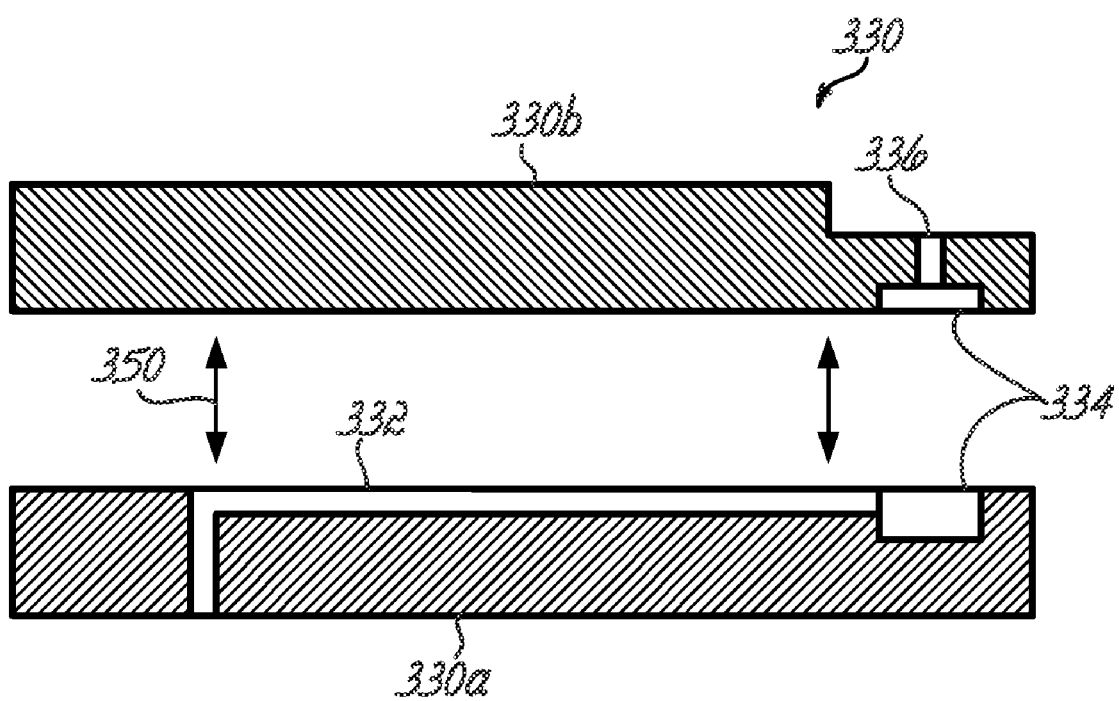
FIG. 4 illustrates a method of manufacturing a focus ring.

Referring to FIG. 4, an embodiment of the focus ring 230 of FIG. 3 is the focus ring 330, which may originate in two pieces, including an upper portion 330B and a lower portion 330B, wherein the gas distribution passage(s) 332, gas plenum(s) 334 and the gas injection orifice(s) 336 are machined into the upper portion 330B and the lower portion 330A as illustrated. Following the machining of these features, the upper portion 330B and the lower portion 330A can be bonded to one another using a bonding agent 350. For example, focus ring 330 (130, 230) may be fabricated from quartz, and the bonding agent 350 can include quartz frit. To manufacture the quartz frit, a dopant is placed in ground quartz to lower its melting temperature. Thereafter, the quartz frit may be suspended within a solvent, such as acetone, and applied to the bonding surfaces of the upper portion 330B and the lower portion 330A using spray coating equipment and masking techniques. Once the frit coating is applied to the bonding surfaces, the upper portion 330B and the lower portion 330A are joined together under mechanical pressure in a kiln and fired at a temperature sufficient to melt the frit. Quartz fusing processes are known to those skilled in the art of quartz processing.

Referring again to FIG. 1, the substrate holder 2 can further comprise a temperature control system having one or more temperature control elements. The temperature control system can include a heating system, or a cooling system, or both. For example, substrate holder 2 can include a substrate heating element or substrate cooling element (not shown) beneath the surface of the substrate holder 2. For instance, the heating system or cooling system can include a re-circulating fluid flow that receives heat from substrate holder 2 and transfers heat to a heat exchanger system (not shown) when cooling, or transfers heat from the heat exchanger system to the table when heating. The cooling system or heating system may include heating/cooling elements, such as resistive heating elements, or thermo-electric heaters/coolers located within substrate holder 2. Additionally, the heating elements or cooling elements or both can be arranged in more than one separately controlled temperature zone.

Additionally, the upper surface of the substrate holder 2 may be provided with an array of gas ports through which a heat transfer gas, such as helium, can be introduced to, or removed from, the space between the backside of the substrate 3 and the upper surface of the substrate holder 2. The introduction of heat transfer gas to the backside of the substrate facilitates an increase in the thermal conduction between the substrate 3 and substrate holder 2.

Controller 20 may typically include a microprocessor, a memory, and a digital input/output (I/O) port, potentially including digital/analog (D/A) and/or A/D converters, capable of generating control voltages sufficient to communicate and activate inputs to vacuum processing system 1 as well as monitor outputs from vacuum processing system 1. As shown in FIG. 1, controller 20 can be coupled to and exchange information with process gas supply control system 7, additive process gas supply system 12 and vacuum pumping system 9. A program stored in the memory interacts with the components of the vacuum processing system 1 according to a stored process recipe.

The controller 20 may also be implemented as a general purpose computer, processor, digital signal processor, etc., which causes a thermal treatment assembly to perform a portion or all of the processing steps of the invention in response to the controller 20 executing one or more sequences of one or more instructions contained in a computer readable medium. The computer readable medium or memory is configured to hold instructions programmed according to the teachings of the invention and can contain data structures, tables, records, or other data described herein. One example of controller 20 may be a general purpose computer such as a DELL PRECISION WORKSTATION 640™, available from Dell Corporation, Austin, Tex. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave, or any other medium from which a computer can read.

Controller 20 may be locally located relative to vacuum processing system 1, or it may be remotely located relative to vacuum processing system 1, connected thereto via an internet or intranet. Thus, controller 20 can exchange data with vacuum processing system 1 using at least one of a direct connection, an intranet, or the internet. Controller 20 may be coupled to an intranet at a customer site (i.e., a device maker, etc.), or coupled to an intranet at a vendor site (i.e., an equipment manufacturer). Furthermore, another computer (i.e., controller, server, etc.) can access controller 20 to exchange data via at least one of a direct connection, an intranet, or the internet.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

Accordingly, what is claimed is:

1. A focus-ring configured to surround a peripheral edge of a substrate in a vacuum processing system, comprising:
   a ring having an upper surface and a lower surface;
   a plurality of gas distribution passages, each of the plurality being coupled to the lower surface of said ring, each of the plurality of gas distribution passages being configured to further couple to one or more corresponding gas supply passages within an upwardly facing substrate holder when said ring is made to rest upon said substrate holder to supply an additive process gas from said substrate holder to said plurality of gas plenums;
   a plurality of separate and distinct gas plenums distributed circumferentially within said ring between the upper surface and the lower surface, each of the plurality of separate and distinct gas plenums being respectively coupled to at least one correspondingly separate and distinct one of the plurality of gas distribution passages;
   a plurality of gas injection orifices distributed circumferentially in the upper surface of the ring, each of the plurality of gas plenums being coupled to a separate and distinct plurality of gas injection orifices wherein the gas injection orifices of each separate and distinct plurality are arranged to distribute the additive process gas from the plurality of gas plenums to which they are coupled to a corresponding separate one of a plurality of regions above the upper surface and distributed circumferentially around said peripheral edge of the substrate when supported and centered on said substrate holder;
   an upwardly facing substrate holder having the one or more corresponding gas supply passages therein, the ring resting thereon; and
   an additive gas supply system coupled to the one or more corresponding gas supply passages and configured to control the supply of said additive process gas differently to different ones of said corresponding gas supply passages to vary the distribution of said additive process gas differently to different ones of the corresponding separate ones of the plurality of regions above the upper surface of the ring to affect the introduction across a surface of the substrate,
   wherein said ring comprises an upper portion and a lower portion, said upper portion and said lower portion being machined to form said plurality of gas distribution passages therein and being bonded together using a bonding agent.

2. The ring of claim 1, wherein the separate and distinct pluralities of gas injection orifices are distributed at equal angular intervals about the circumference of said ring.

3. The ring of claim 1, wherein said plurality of gas plenums are distributed at equal angular intervals about the circumference of said ring.

4. The ring of claim 1, wherein said pluralities of gas plenums, gas distribution passages, and gas injection orifices are coupled such that the additive process gas or a gas composition of the additive process gas, when supplied at a varied flow rate from the one or more gas supply passages on the substrate holder on which said ring rests, is distributed at different flow rates to the plurality of regions above the upper surface of the ring.

5. The ring of claim 1, wherein said ring comprises quartz, silicon, single crystal silicon, polycrystalline silicon, silicon nitride, silicon carbide, carbon, glassy carbon, alumina, sapphire, or aluminum nitride, or a combination of two or more thereof.

6. The ring of claim 1, wherein each of said upper portion and said lower portion comprises quartz, said bonding agent comprises quartz frit that is applied to one or more bonding surfaces on said upper portion or said lower portion or both portions, and wherein the bonding of said upper portion and said lower portion is performed while assembling said upper portion and said lower portion under mechanical pressure within a kiln and raising the temperature of said upper and lower portions to a temperature sufficient to melt said quartz frit.

7. A processing apparatus having the ring of claim 1 and further comprising:
an additive gas supply system operable to differently control the supply of the additive process gas to different ones of said corresponding gas supply passages to vary the introduction of said additive process gas angularly around the perimeter of the substrate.

8. A substrate holder assembly having the ring of claim 1 and further comprising:
an upwardly facing substrate holder having the one or more gas supply passages therein.

* * * * *